(12) United States Patent
Vasilache et al.

(10) Patent No.: US 9,196,255 B2
(45) Date of Patent: Nov. 24, 2015

(54) LOW COMPLEXITY TARGET VECTOR IDENTIFICATION

(75) Inventors: Adriana Vasilache, Tampere (FI); Lasse Juhani Laaksonen, Nokia (FI); Anssi Sakari Rämö, Tampere (FI); Mikko Tapio Tammi, Tampere (FI)

(73) Assignee: Nokia Technologies Oy, Espoo (FI)

( * ) Notice: Subject to any disclaimer, the term of this patent is extended or adjusted under 35 U.S.C. 154(b) by 282 days.

(21) Appl. No.: 13/988,952

(22) PCT Filed: Nov. 26, 2010

(86) PCT No.: PCT/IB2010/055448
§ 371 (c)(1),
(2), (4) Date: May 22, 2013

(87) PCT Pub. No.: WO2012/069885
PCT Pub. Date: May 31, 2012

(65) Prior Publication Data
US 2013/0238346 A1    Sep. 12, 2013

(51) Int. Cl.
*G10L 19/00* (2013.01)
*G10L 19/038* (2013.01)
*H03M 7/30* (2006.01)

(52) U.S. Cl.
CPC ........... *G10L 19/0019* (2013.01); *G10L 19/038* (2013.01); *H03M 7/3082* (2013.01)

(58) Field of Classification Search
None
See application file for complete search history.

(56) References Cited

U.S. PATENT DOCUMENTS

| 4,958,225 A | 9/1990 | Bi et al. | |
|---|---|---|---|
| 7,272,593 B1 * | 9/2007 | Castelli et al. | 707/600 |

(Continued)

FOREIGN PATENT DOCUMENTS

| EP | 0505654 | 9/1992 |
|---|---|---|
| WO | 2009100768 | 8/2009 |
| WO | 2012/069886 A1 | 5/2012 |

OTHER PUBLICATIONS

International Search Report received for corresponding Patent Cooperation Treaty Application No. PCT/IB2010/055448, dated Aug. 29, 2011, 5 pages.

(Continued)

*Primary Examiner* — Jeremiah Bryar
(74) *Attorney, Agent, or Firm* — Nokia Technologies Oy

(57) ABSTRACT

It is inter alia disclosed to identify one or more target vectors from a plurality of candidate vectors, each candidate vector having sorted elements and being associated with a respective class of one or more code vectors of a codebook and at least one of the candidate vectors being associated with a respective class of two or more code vectors that comprise the respective candidate vector and at least one code vector obtainable from the respective candidate vector by one of permutation and signed permutation, the target vectors having, among all candidate vectors of the plurality of candidate vectors, smallest distances towards a at least sorted representation of an input vector. The identifying comprises checking, for a candidate vector of the plurality of candidate vectors, at least based on a distance between the candidate vector and a reference vector and on a distance between the reference vector and the at least sorted representation of the input vector, if a distance between the at least sorted representation of the input vector and the candidate vector is larger than a distance between the at least sorted representation of the input vector and the reference vector. The identifying further comprises computing, for the candidate vector, the distance between the at least sorted representation of the input vector and the candidate vector only if the checking yields a negative result.

22 Claims, 5 Drawing Sheets

(56) References Cited

U.S. PATENT DOCUMENTS

| | | | |
|---|---|---|---|
| 7,729,553 B2* | 6/2010 | Fievet | 382/253 |
| 8,306,820 B2* | 11/2012 | Kunstmann | 704/245 |
| 8,972,837 B2* | 3/2015 | Mittelholzer et al. | 714/805 |
| 2007/0094027 A1 | 4/2007 | Vasilache | |
| 2007/0168197 A1 | 7/2007 | Vasilache | |
| 2010/0014577 A1 | 1/2010 | Vasilache et al. | |
| 2010/0292986 A1 | 11/2010 | Vasilache et al. | |

OTHER PUBLICATIONS

Ramasubramanian V. et al. "An Efficient Approximation—Elimination Algorithm for Fast Nearest—Neighbor Search". In: Proceeding of the International Conference on Acoustics, Speech and Signal Processing (ICASSP), Mar. 23, 1992, vol. 1, pp. 89-92.

Vasilache A. et al. "Multiple-Scale Leader-Lattice VQ with Application to LSF Quantization" [online]. In: Signal Processing vol. 82, Iss. 4, Apr. 2002, pp. 563-586.

Office Action received from corresponding Chinese Application No. 201080071139.5, dated Aug. 13, 2014.

Office Action received for corresponding Korean Application No. 2013-7016566, dated May 2, 2014, 4 pages.

Extended European Search Report and Written Opinion received for corresponding European Application No. 10860073.5, dated May 8, 2014, 6 pages.

Anonymous, "Vector Quantization,", internet article. Aug. 9, 2009, retrieved from Internet: URL: htp://www.maqasem.net/vectorquantization/vq.html.

* cited by examiner

LOW COMPLEXITY TARGET VECTOR IDENTIFICATION

RELATED APPLICATION

This application was originally filed as PCT Application No. PCT/IB2010/055448 filed Nov. 26, 2010.

FIELD

Embodiments of this invention relate to coding, in particular to speech and audio coding.

BACKGROUND

Low complexity algorithms for speech and audio coding constitute a very relevant asset, for instance for mobile terminal based communications. Due to low storage and low complexity, while preserving coding efficiency, structured codebooks may be preferred in several state of the art speech and audio codecs, like for instance the Enhanced Voice Service (EVS) codec to be standardized within the Third Generation Partnership Project (3GPP).

Codebooks used within these speech and audio codecs may for instance be based on lattice structures, as described in reference "Multiple-scale leader-lattice VQ with application to LSF quantization" by A. Vasilache, B. Dumitrescu and I. Tabus, Signal Processing, 2002, vol. 82, pages 563-586, Elsevier, which is incorporated herein in its entirety by reference.

It is possible to define a lattice codebook as a union of leader classes, each of which is characterized by a leader vector. A leader vector is an n-dimensional vector (with n denoting an integer number), whose (e.g. positive) components are ordered (e.g. decreasingly). The leader class corresponding to the leader vector then consists of the leader vector and all vectors obtained through all the signed permutations of the leader vector (with some possible restrictions). It is also possible that one, some or all leader classes are respectively associated with one or more scales, and the lattice codebook is then formed as a union of scaled and/or unscaled leader classes.

An input vector may for instance be encoded (for instance in quantization) by finding the nearest neighbor code vector in the codebook, i.e. the code vector that has the smallest distance with respect to the input vector. An identifier of this code vector (e.g. an index assigned to this code vector) then may serve as an encoded representation of the input vector.

SUMMARY OF SOME EMBODIMENTS OF THE INVENTION

Although the use of structured codebooks already reduces the amount of memory and the computational complexity required for encoding an input vector, further reduction of the memory requirements and/or the computational complexity is desirable, for instance with respect to application of codebook-based encoding in mobile devices.

According to a first aspect of the invention, a method is disclosed, comprising identifying one or more target vectors from a plurality of candidate vectors, each candidate vector having sorted elements and being associated with a respective class of one or more code vectors of a codebook and at least one of the candidate vectors being associated with a respective class of two or more code vectors that comprise the respective candidate vector and at least one code vector obtainable from the respective candidate vector by one of permutation and signed permutation, the target vectors having, among all candidate vectors of the plurality of candidate vectors, smallest distances towards an at least sorted representation of an input vector. The identifying comprises checking, for a candidate vector of the plurality of candidate vectors, at least based on a distance between the candidate vector and a reference vector and on a distance between the reference vector and the at least sorted representation of the input vector, if a distance between the at least sorted representation of the input vector and the candidate vector is larger than a distance between the at least sorted representation of the input vector and the reference vector. The identifying further comprises computing, for the candidate vector, the distance between the at least sorted representation of the input vector and the candidate vector only if the checking yields a negative result. The method according to the first aspect of the invention may for instance be a method for quantizing and/or encoding the input vector.

According to a second aspect of the invention, an apparatus is disclosed, which is configured to perform the method according to the first aspect of the invention, or which comprises means for performing the method according to the first aspect of the invention, i.e. means for identifying the one or more target vectors, which in turn comprise means for checking if a distance between the at least sorted representation of the input vector and the candidate vector is larger than a distance between the at least sorted representation of the input vector and the reference vector, and means for computing the distance between the at least sorted representation of the input vector and the candidate vector only if the checking yields a negative result.

According to a third aspect of the invention, an apparatus is disclosed, comprising at least one processor and at least one memory including computer program code, the at least one memory and the computer program code configured to, with the at least one processor, cause the apparatus at least to perform the method according to the first aspect of the invention. The computer program code included in the memory may for instance at least partially represent software and/or firmware for the processor. Non-limiting examples of the memory are a Random-Access Memory (RAM) or a Read-Only Memory (ROM) that is accessible by the processor.

According to a fourth aspect of the invention, a computer program is disclosed, comprising program code for performing the method according to the first aspect of the invention when the computer program is executed on a processor. The computer program may for instance be distributable via a network, such as for instance the Internet. The computer program may for instance be storable or encodable in a computer-readable medium. The computer program may for instance at least partially represent software and/or firmware of the processor.

According to a fifth aspect of the invention, a computer-readable medium is disclosed, having a computer program according to the fourth aspect of the invention stored thereon. The computer-readable medium may for instance be embodied as an electric, magnetic, electro-magnetic, optic or other storage medium, and may either be a removable medium or a medium that is fixedly installed in an apparatus or device. Non-limiting examples of such a computer-readable medium are a RAM or ROM. The computer-readable medium may for instance be a tangible medium, for instance a tangible storage medium. A computer-readable medium is understood to be readable by a computer, such as for instance a processor.

In the following, features and embodiments pertaining to all of these above-described aspects of the invention will be briefly summarized.

As described above, each candidate vector is associated with a respective class of one or more code vectors. Therein, the code vectors of all classes of code vectors are from the same codebook. The classes of code vectors respectively associated with different candidate vectors may for instance be mutually different. The classes of code vectors may for instance be considered to form different parts of a codebook.

Therein, the respective sizes of the classes of code vectors associated with the candidate vectors may be the same or at least partially (i.e. for at least some of the candidate vectors) different.

The elements of each candidate vector are sorted, for instance decreasingly or increasingly.

The elements of the candidate vectors may for instance all be positive, or all be negative, or obey another (e.g. pre-defined) sign norm, to name but a few non-limiting examples.

A candidate vector may for instance be considered to be associated with its associated class of code vectors since at least this candidate vector is comprised as a code vector in this class. This may for instance be the case for all candidate vectors of the plurality of candidate vectors.

At least one candidate vector is associated with a respective class of two or more code vectors. In such a case, one of the two or more code vectors is the candidate vector associated with the class of two or more code vectors itself, and at least one of the further code vectors is a code vector that is obtainable from the candidate vector by permutation (for instance rearrangement of elements of a vector) or signed permutation (for instance rearrangement of elements of a vector and/or change of one or more signs of elements of a vector). It may for instance be the case that a class of code vectors associated with a candidate vector comprises the candidate vector, and wherein all other code vectors of the class of code vectors are obtainable from the candidate vector by permutation or signed permutation. This may for instance hold for the classes of code vectors respectively associated with several or all candidate vectors of the plurality of candidate vectors.

At least one candidate vector may for instance be associated with a class of one or more code vectors that only comprises one code vector that equals the candidate vector. This candidate vector may for instance be a null vector (that has only zero-valued elements). In this case, no further code vectors can be generated by permutation or signed permutation.

The classes of code vectors respectively associated with the candidate vectors of the plurality of candidate vectors may for instance all comprise more than one code vector, except one class of code vectors that only comprises one code vector (e.g. the null vector). Equally well, also all classes of code vectors respectively associated with the candidate vectors of the plurality of candidate vectors may comprise more than one code vector.

Some or all of the candidate vectors may for instance be leader vectors that are respectively associated with leader classes, each containing a respective plurality of one or more code vectors. A leader vector may for instance be a vector that has positive elements ordered decreasingly (or increasingly). The leader class associated with the leader vector may for instance comprise the leader vector and all vectors obtained by a signed permutation of the leader vector (which may for instance mean that, in case that a leader vector is the null vector, no signed permutations are possible, and thus the leader class only comprises the null vector), wherein there may exist some restrictions on the sign combinations, such as for instance that the number of signs in a vector has to be even or odd. The union of the leader classes may for instance form the codebook (e.g. a lattice codebook). This codebook may for instance be used for quantization, for instance of speech, audio and/or video signals.

Alternatively, some or all of the candidate vectors may for instance be scaled representations of one or more leader vectors. For instance, there may exist N leader vectors, each of which being associated with a respective leader class, and each of these leader classes being associated with a set of L different scales (scaling factors), which may be the same or different for the different leader classes. The codebook may then for instance be formed as a union of N·L scaled leader classes, which are respectively represented by N·L scaled representations of leader vectors (wherein the are N groups each comprising L scaled representations of leader vectors pertaining to the same leader vector).

Equally well, one or more of the candidate vectors may be leader vectors, and some or more of the candidate vectors may be scaled representations of one or more leader vectors.

From the plurality of candidate vectors, one or more target vectors are identified. The target vectors thus are candidate vectors.

The target vectors have, among all candidate vectors of the plurality of candidate vectors, smallest distances (according to a distance function, e.g. a pre-defined distance function) towards an at least sorted representation of an input vector.

Identification of the one or more target vectors from the candidate vectors may be useful, since, for each candidate vector of the plurality of candidate vectors, the distance between this candidate vector and the at least sorted representation of the input vector equals the distance of that code vector of the class of code vectors associated with the candidate vector that has—among all code vectors of this class of code vectors—the smallest distance towards the input vector.

If only one target vector is identified, this target vector has the smallest distance towards the at least sorted representation of the input vector. Furthermore, this target vector is then also associated with the class of code vectors that contains the code vector that has, among all code vectors of the codebook, the smallest distance towards the input vector.

If two target vectors are identified, these two target vectors have then—among all candidate vectors of the plurality of candidate vectors—the two smallest distances towards the at least sorted representation of the input vector. These distances may be the same, but may equally well be different. This holds similarly in case of more than two target vectors.

The target vectors may not necessarily be associated with respective classes of code vectors that comprise respective code vectors that have, among all code vectors of the codebook, the smallest distances towards the input vector (for instance in a way that the first target vector is associated with a code vector that has the smallest distance towards the input vector, and the second target vector is associated with a code vector that has the second smallest distance towards the input vector). For instance, if two target vectors (a first target vector and a second target vector as described above) are identified, it may be the case that they are not respectively associated with the first and the second closest code vectors from the codebook with respect to the input vector, but may be to the first and only the third closest code vectors from the codebook with respect to the input vector. This is due to the fact that the second closest code vector from the entire codebook may as well be associated with the first target vector. However, from an application point of view, this might be of no interest because code vectors associated with the same target vector may require the same number of bits for their representation. For instance, there may be no use letting go on the quality (higher distortion/distortion), if the same bitrate is used (i.e.

then the first closest code vector and not the inferior second closest code vector is used, since both require the same number of bits).

The input vector may for instance be received in a step of the method according to the first aspect of the invention, and the apparatuses according to the second or third aspect of the invention, the computer program according to the fourth aspect of the invention and the computer-readable medium according to the fifth aspect of the invention may then be configured accordingly.

The at least sorted representation of the input vector may for instance be obtained from the input vector by only sorting its elements, for instance in the same manner as the elements of the candidate vectors are sorted (e.g. decreasingly or increasingly). To obtain the at least sorted representation of the input vector, however also one or more further transformation steps may be performed, for instance transforming elements of the input vector to obey the same sign norm as the candidate vectors (e.g. that all elements of the input vector have to be positive or that all elements have to be negative), and sorting the resulting transformed elements, for instance in the same manner as the elements of the candidate vectors. The at least sorted representation of the input vector is thus for instance also considered to comprise a sorted sign-transformed representation of the input vector, e.g. a sorted absolute-valued representation of an input vector in which all elements of the input vector have been transformed into their absolute values and subsequently sorted.

Once the one or more target vectors have been identified, for each target vector, the code vector that has—among all code vectors in the class of code vectors associated with the target vector—the smallest distances towards the input vector may then be determined, for instance by permuting elements and/or assigning signs to elements of the target vector in dependence on the input vector. The one or more target vectors may additionally or alternatively be output, for instance to another (e.g. functional) unit. The one or more target vectors may for instance be output by outputting an identifier (such as for instance an index) of each of the one or more target vectors. The one or more target vectors may for instance be output together with the respective distance of the target vector to the at least sorted representation of the input vector. Based on these distances, a further selection of one or more target vectors from the one or more target vectors may then for instance be possible, for instance to arrive at a finally selected target vector (with the code vector associated with this finally selected target vector being for instance used for quantization/encoding of the input vector).

According to the above-described aspects of the invention, the at least sorted representation of the input vector is compared against at least one of the candidate vectors of the plurality of candidate vectors. This at least sorted representation may for instance be produced in a step of the method according to the first aspect of the invention, and the apparatuses according to the second or third aspect of the invention, the computer program according to the fourth aspect of the invention and the computer-readable medium according to the fifth aspect of the invention may then be configured accordingly.

However, to avoid—if possible—that the distance of the input vector with respect to all candidate vectors of the plurality of candidate vectors has to be computed, it is checked for a candidate vector if a distance between the at least sorted representation of the input vector and the candidate vector is larger than a distance between the at least sorted representation of the input vector and a reference vector. This checking may for instance be performed in a respective iteration of a loop that checks all candidate vectors of the plurality of candidate vectors or all candidate vectors minus one preselected or arbitrarily selected candidate vector, in order to identify the target vector.

Therein, the reference vector may for instance be a candidate vector of the plurality of candidate vectors that has, among the candidate vectors checked so far with respect to the at least sorted representation of the input vector, the smallest distance towards the at least sorted representation of the input vector. If no other candidate vectors have been checked so far with respect to the at least sorted representation of the input vector, the reference vector may for instance be a predefined one or randomly chosen one of the plurality of candidate vectors. It may also be possible that the reference vector is a candidate vector of the plurality of candidate vectors, but that it is kept fixed during all checking performed for candidate vectors of the plurality of candidate vectors.

Therein, in the checking, it is avoided to actually compute the distance between the at least sorted representation of the input vector and the candidate vector. This reduces the computational complexity. Instead, the checking is performed at least based on a distance between the candidate vector and the reference vector, and on a distance between the reference vector and the at least sorted representation of the input vector. The former distance may for instance be retrieved from a pre-computed database that comprises distances between all pairings of candidate vectors (or distances between the reference vector and all candidate vectors that do not equal the reference vector), and the latter distance may for instance be already available from a previous checking performed for the reference vector.

In the checking, avoidance of the actual computation of the distance between the at least sorted representation of the input vector and the candidate vector may for instance be achieved by exploiting the triangle inequality (or derivatives thereof).

If the checking produced a positive result (i.e. revealed that the distance between the at least sorted representation of the input vector and the candidate vector is larger than the distance between the at least sorted representation of the input vector and the reference vector), the distance between the at least sorted representation of the input vector and the candidate vector is not computed, otherwise it is.

To identify one or more target vectors of a plurality of candidate vectors, it is thus not necessarily required to compute distances between an at least sorted representation of the input vector and all candidate vectors. Instead, by introducing a checking before this computation, it can be assessed if an actual computation of the distance is actually necessary. Some or all of these checking may for instance be based on distances that are already available from previous checkings, or refer to distances between candidate vectors and/or reference vectors that do not change as long as the same codebook is used and may thus be pre-computed (for instance before the input vector is received).

Therein, the distance between the at least sorted representation of the input vector and a candidate vector is the same as the distance between the input vector and the nearest code vector in the class of code vectors associated with the candidate vector. This holds for all candidate vectors in the plurality of candidate vectors. It is thus sufficient to check the candidate vectors (instead of checking all code vectors of the codebook).

The distances between any vectors may for instance be computed according to a distance metric, as for instance a Minkowski metric, such as an Euclidean metric, a Manhattan metric or a Chebychev metric, to name but a few non-limiting examples.

Code vectors of the respective classes of code vectors associated with the one or more target vectors may then for instance serve as a basis for quantizing and/or encoding of the input vector (which may for instance be part of a video signal, image signal, speech signal or audio signal).

The method according to the first aspect of the invention may for instance comprise a step of quantizing and/or encoding the input vector based on the one or more target vectors to obtain a quantized and/or encoded representation of the input vector, for instance based on code vectors of the respective classes of code vectors associated with the one or more target vectors. The apparatuses according to the second or third aspect of the invention, the computer program according to the fourth aspect of the invention and the computer-readable medium according to the fifth aspect of the invention may then be configured accordingly. For instance, if only a single target vector is obtained, the input vector may be quantized based on a code vector of the class of code vectors associated with this target vector, for instance the code vector that has, among all code vectors in this class of code vectors, the smallest distance towards the input vector. This code vector may for instance be represented by an identifier (e.g. a bit string) that then constitutes the quantized and encoded representation of the input vector. If several target vectors are identified, encoding/quantizing of the input vector may for instance comprise identifying the respective code vectors from the respective classes of code vectors associated with the target vectors that have—among the code vectors of the respective class of code vectors—the smallest distance towards the input vector, selecting a code vector from these identified code vectors (for instance under consideration of the respective number of bits required to represent these code vectors and/or the respective distance of these code vectors from the input vector) and representing the selected code vector with an identifier.

According to an exemplary embodiment of all aspects of the invention, the checking if a distance between the at least sorted representation of the input vector and the candidate vector is larger than the distance between the at least sorted representation of the input vector and the reference vector is performed by checking if an absolute value of a difference between the distance between the candidate vector and the reference vector and the distance between the reference vector and the at least sorted representation of the input vector is larger than the distance between the reference vector and the at least sorted representation of the input vector. This kind of checking is derivable from the triangle inequality.

According to an exemplary embodiment of all aspects of the invention, the checking and, in case that the respective checking yields a negative result, the computing of the distance may for instance be performed in the identifying of the one or more target vectors for all candidate vectors of the plurality of candidate vectors except one candidate vector that is used at least once as the reference vector (e.g. initially, e.g. when the identifying is performed for a new input vector for the first time). The distance between this candidate vector serving as reference vector and the at least sorted representation of the input vector may nevertheless have to be computed for later reference.

According to an exemplary embodiment of all aspects of the invention, the reference vector is a pre-selected or randomly chosen candidate vector from the plurality of candidate vectors. The reference vector may for instance be pre-defined to be always the first candidate vector of the plurality of candidate vectors, or may be randomly chosen among the plurality of candidate vectors, for instance each time a new input vector is received. The reference vector may for instance also be pre-selected from the plurality of candidate vectors based on an analysis of one or more characteristics of a plurality of input vectors, and/or based on one or more statistical properties of the input vector.

According to an exemplary embodiment of all aspects of the invention, the identifying (of the one or more target vectors) further comprises, in case the checking for the candidate vector yields a negative result, checking if the computed distance between the at least sorted representation of the input vector and the candidate vector is smaller than (or as an alternative: smaller than or equal to) the distance between the reference vector and the at least sorted representation of the input vector, and defining the reference vector to be the candidate vector if the computed distance between the at least sorted representation of the input vector and the candidate vector is smaller than (or, in the alternative given above: smaller than or equal to) the distance between the reference vector and the at least sorted representation of the input vector.

If the checking that the distance between the at least sorted representation of the input vector and the candidate vector is larger than the distance between the at least sorted representation of the input vector and the reference vector is negative, no information on the relationship between the distance between the at least sorted representation of the input vector and the candidate vector on the one hand and the distance between the at least sorted representation of the input vector and the reference vector on the other hand may be available. Thus the distance between the at least sorted representation of the input vector and the candidate vector is computed and compared against the distance between the at least sorted representation of the input vector and the reference vector, and if the computed distance between the at least sorted representation of the input vector and the candidate vector is smaller than the distance between the reference vector and the at least sorted representation of the input vector, the candidate vector is made the reference vector (the reference vector is re-defined).

When several checkings for respective candidate vectors of the plurality of candidate vectors are performed, this ensures that the reference vector is always the candidate vector with the up-to-then lowest distance with respect to the at least sorted representation of the input vector.

Therein, for instance only one target vector may be identified from the plurality of candidate vectors, and the target vector may then correspond to the reference vector after a last candidate vector of the plurality of candidate vectors has been checked. After the last candidate vector of the plurality of candidate vectors has been checked with respect to the at least sorted representation of the input vector, the reference vector thus represents the target vector that is associated with the class of code vectors that contains the code vector that has, among all code vectors of the codebook, the smallest distance towards the input vector.

The distance between the candidate vector and the reference vector may for instance be retrieved from a memory that comprises distances with respect to all possible pairings of candidate vectors of the plurality of candidate vectors. The distances may for instance be pre-computed (for instance prior to the reception of the input vector. The distances may for instance be contained in a ROM of an apparatus that implements the method according to the first aspect of the invention or in an apparatus according to the second and third aspect of the invention, or in a firmware portion of such an apparatus. It may for instance be possible to update/change these distances if the codebook changes. Since the distances between candidate vectors are independent from the input vector, it is computationally efficient and thus advantageous to pre-compute and store them in the memory to avoid that these distances have to be computed again and again to be able to perform the checking if the distance between the at least sorted representation of a current input vector and the candidate vector is larger than the distance between the at least sorted representation of the current input vector and the reference vector.

The distance between the reference vector and the at least sorted representation of the input vector may correspond to a distance between a previously checked candidate vector of the plurality of candidate vectors and the at least sorted representation of the input vector computed for the previously checked candidate vector, and may be retrieved from a memory where it has been at least temporarily stored. This, in addition to (but basically independent from) the storage of the pre-computed distances between all pairings of candidate vectors further vastly contributes to reduce the computational complexity of the identification of the target vector. Accordingly, the identification of the target vector may thus for instance further comprise at least temporarily storing the computed distance between the at least sorted representation of the input vector and the candidate vector to be referred to later.

According to an exemplary embodiment of all aspects of the invention, in the identifying of the one or more target vectors with respect to an input vector, the checking is performed for at least several candidate vectors of the plurality of candidate vectors, and wherein in each checking, the same reference vector is used. The reference vector may for instance be a candidate vector from the plurality of candidate vectors, for instance a null vector. The reference vector may be pre-defined or pre-selected from the plurality of candidate vectors.

The checking may for instance be performed for all candidate vectors of the plurality of candidate vectors, except the candidate vector that is used as reference vector.

Alternatively, the checking may be performed for all candidate vectors of the plurality of candidate vectors, for instance in case the reference vector is not one of the candidate vectors. Using the same (e.g. a constant) reference vector in the checking may for instance allow to identify more than one target vector and thus consequently more than one code vectors that have small distances towards the input vector. This may for instance be exploited in scenarios where at least some of the classes of code vectors respectively associated with the candidate vectors afford different numbers of bits for encoding. When having multiple code vectors (from different classes of code vectors with at least partially different bit requirements) that can all be considered to be close to the input vector and thus suited as a coded/quantized representation of the input vector, thus a trade-off between accuracy and bit requirements can be made (for instance, instead of selecting the code vector that is closest to the input vector, a code vector farther away from the input vector (e.g. the second closest code vector) may be chosen, since it requires less bits but still constitutes a comparably accurate representation of the input vector).

The distance between the candidate vector and the reference vector may then be retrieved from a memory that comprises distances between the reference vector and all candidate vectors of the plurality of candidate vectors, or a memory that comprises distances between the reference vector and all candidate vectors of the plurality of candidate vectors except the reference vector, in case that the reference vector is one of the candidate vectors. Since these distances are independent from the input vector, these distances may for instance be pre-computed (for instance before the input vector is received, for instance in a firmware of an apparatus according to the second and third aspect of the present invention.

In the identifying of the one or more target vectors with respect to an input vector, the distance between the reference vector and the at least sorted representation of the input vector may only be computed once. Since neither reference vector nor the input vector change during the identifying of the one or more target vector with respect to an input vector, it is advisable to compute and at least temporarily store this distance only once (for instance prior to the first checking) and then to retrieve it in subsequent checkings.

According to an exemplary embodiment of all aspects of the invention, the method according to the first aspect of the invention may further comprise determining, for at least one of the one or more target vectors, a respective code vector contained in the respective class of code vectors associated with the at least one target vector that has, among all code vectors in the respective class of code vectors, the smallest distance towards the input vector. The apparatuses, computer programs and computer-readable medium according to the further aspects of the invention may then be configured accordingly. Therein, even if several target vectors have been identified, it may only be desired to actually determine a sub-group (e.g. only one) of the respectively associated code vectors. For instance, only the code vector that shall actually serve as an encoded/quantized representation of the input vector may be determined based on its associated target vector.

The determining of the respective code vector may then for instance comprise: applying a permutation operation to the target vector associated with the class of code vectors that contains the respective code vector that would undo a sorting of the at least sorted representation of the input vector to obtain a permuted representation of the target vector; assigning signs to elements of the permuted representation of the target vector that equal signs of elements at corresponding positions in the input vector to obtain a signed permuted representation of the target vector, and toggling, only if a sign constraint is imposed on the class of code vectors associated with the target vector and if the sign constraint is not met by the signed permuted representation of the target vector, a sign of a smallest element of the signed permuted representation of the target vector to obtain the code vector, and considering the signed permuted representation of the target vector as the code vector, otherwise.

According to an exemplary embodiment of all aspects of the invention, the input vector at least partially represents at least one of a video, image, audio and speech signal.

According to an exemplary embodiment of all aspects of the invention, the identifying of the target vector forms part of a Third Generation Partnership Project (3GPP) speech and/or audio codec, in particular an Enhanced Voice Service (EVS) codec.

Other features of all aspects of the invention will be apparent from and elucidated with reference to the detailed description of embodiments of the invention presented hereinafter in conjunction with the accompanying drawings. It is to be understood, however, that the drawings are designed solely for purposes of illustration and not as a definition of the limits of the invention, for which reference should be made to the appended claims. It should further be understood that the drawings are not drawn to scale and that they are merely intended to conceptually illustrate the structures and procedures described therein. In particular, presence of features in the drawings should not be considered to render these features mandatory for the invention.

DETAILED DESCRIPTION OF EMBODIMENTS OF THE INVENTION

Figure 1:
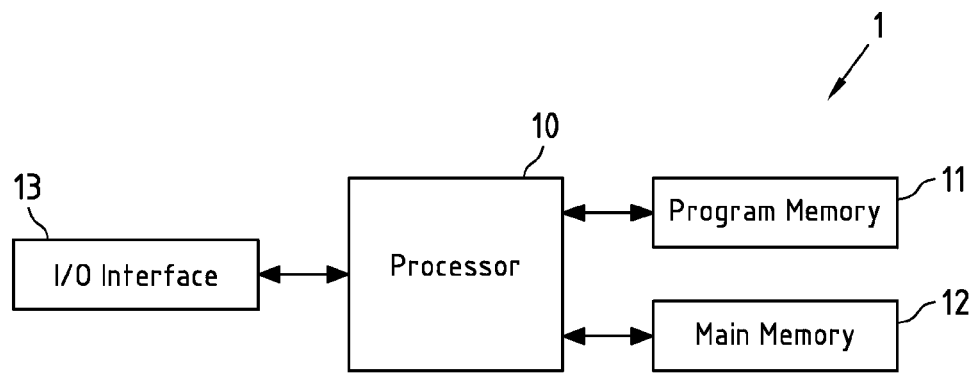
FIG. 1: A schematic illustration of an apparatus according to an embodiment of the invention.

FIG. 1 schematically illustrates components of an apparatus 1 according to an embodiment of the invention. Apparatus 1 may for instance be an electronic device that is for instance capable of encoding at least one of speech, audio and video signals, or a component of such a device. Apparatus 1 is in particular configured to identify one or more target vectors from a plurality of candidate vectors. Apparatus 1 may for instance be embodied as a module. Non-limiting examples of apparatus 1 are a mobile phone, a personal digital assistant, a portable multimedia (audio and/or video) player, and a computer (e.g. a laptop or desktop computer).

Apparatus 1 comprises a processor 10, which may for instance be embodied as a microprocessor, Digital Signal Processor (DSP) or Application Specific Integrated Circuit (ASIC), to name but a few non-limiting examples. Processor 10 executes a program code stored in program memory 11, and uses main memory 12 as a working memory, for instance to at least temporarily store intermediate results, but also to store for instance pre-defined and/or pre-computed databases. Some or all of memories 11 and 12 may also be included into processor 10. Memories 11 and/or 12 may for instance be embodied as Read-Only Memory (ROM), Random Access Memory (RAM), to name but a few non-limiting examples. One of or both of memories 11 and 12 may be fixedly connected to processor 10 or removable from processor 10, for instance in the form of a memory card or stick.

Processor 10 further controls an input/output (I/O) interface 13, via which processor receives or provides information to other functional units.

As will be described below, processor 10 is at least capable to execute program code for identifying one or more target vectors from a plurality of candidate vectors. However, processor 10 may of course possess further capabilities. For instance, processor 10 may be capable of at least one of speech, audio and video encoding, for instance based on sampled input values. Processor 10 may additionally or alternatively be capable of controlling operation of a portable communication and/or multimedia device.

Apparatus 1 of FIG. 1 may further comprise components such as a user interface, for instance to allow a user of apparatus 1 to interact with processor 10, or an antenna with associated radio frequency (RF) circuitry to enable apparatus 1 to perform wireless communication.

The circuitry formed by the components of apparatus 1 may be implemented in hardware alone, partially in hardware and in software, or in software only, as further described at the end of this specification.

Figure 2:
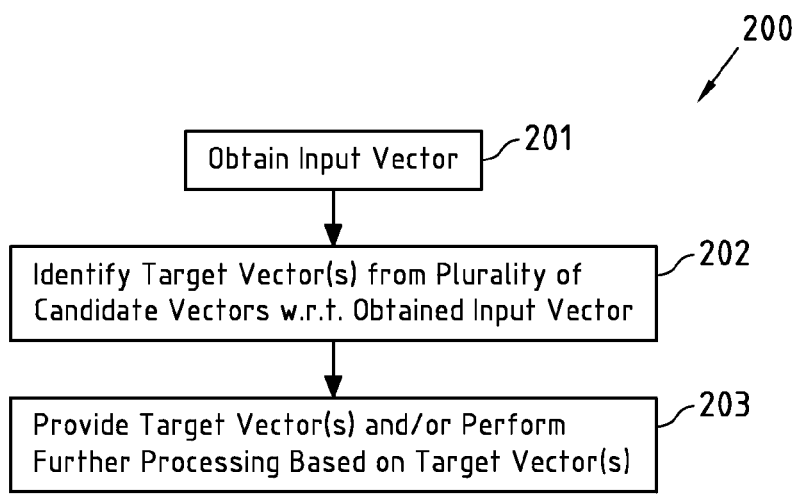
FIG. 2: a flowchart of a method according to an embodiment of the invention.
Figure 3:
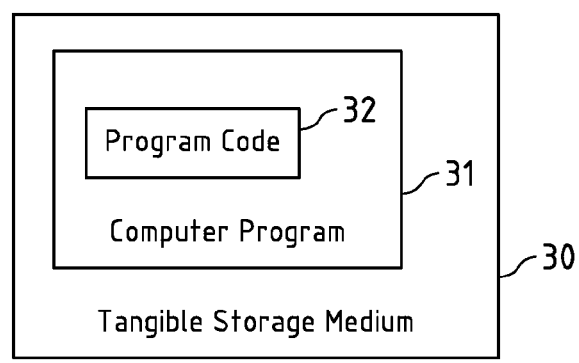
FIG. 3: a tangible storage medium according to an embodiment of the invention.

FIG. 2 shows a flowchart 200 of a method according to an embodiment of the invention. The steps of this flowchart 200 may for instance be defined by respective program code 32 of a computer program 31 that is stored on a tangible storage medium 30, as shown in FIG. 3. Tangible storage medium 30 may for instance embody program memory 11 of FIG. 1, and the computer program 31 may then be executed by processor 10 of FIG. 1.

Returning to FIG. 2, in a step 201, an input vector is obtained. This input vector may for instance be obtained by reception (for instance via I/O interface 13 of FIG. 1), or may be internally obtained from a process or program that is executed by processor 10. This process of program may for instance be part of an encoding process. The input vector may for instance be representative of at least apart of a speech, audio, image and/or video signal. The input vector may for instance comprise differential spectral data or Line Spectral Frequency (LSF) coefficients of a speech signal, to name but a few examples.

In a step 202, one or more target vectors from a plurality of candidate vectors are identified with respect to the input vector obtained in step 201. Therein, each candidate vector (e.g. a leader vector) is associated with a respective class of code vectors (e.g. a leader class associated with the leader vector), wherein the code vectors of this class of code vectors are either the candidate vector or are obtainable from this candidate vector by permutation or signed permutation (where for instance some further restrictions may apply).

Therein, if a candidate vector is the null vector, its associated class of code vectors only comprises the null vector itself. The union of these classes of code vectors forms a codebook. To identify the code vector in this codebook that has the smallest distance with respect to the input vector, it may then be sufficient to identify, from all candidate vectors, the so-called target vector, which is the candidate vector that has the smallest distance to a sorted absolute-valued representation of the input vector, and to determine the code vector that has the smallest distance with respect to the input vector then based on the target vector. As will be explained with reference to FIG. 4 below, the computational complexity of this process of identifying the target vector can be significantly reduced according to embodiments of the invention. Furthermore, as will be shown with reference to FIG. 6 below, it is also possible to identify several target vectors from the plurality of candidate vectors, if several code vectors that are close to the input vector shall be identified.

In a step 203, the one or more target vectors identified in step 202 may be provided, for instance to another component via I/O output 13 of FIG. 1, or internally to another process of program executed by processor 10. Alternatively or additionally, further processing based on the one or more target vectors may be performed (by processor 10). For instance, if only a single target vector is identified, the code vector that has the smallest distance towards the input vector may be determined based on the target vector. This code vector may for instance be associated with a respective identifier, such as for instance an index, and this identifier may then represent an encoded and quantized representation of the input vector. This representation may then for instance be output via I/O interface of apparatus 1 (see FIG. 1), or may be further processed by processor 10. If more than one target vector is identified, the respectively associated code vectors may be determined based on these target vectors, or a selection of one target vectors (and its associated code vector) may be performed, for instance based on a trade-off between the number of bits required to represent a code vector and the distance of the code vector towards the input vector.

Figure 4:
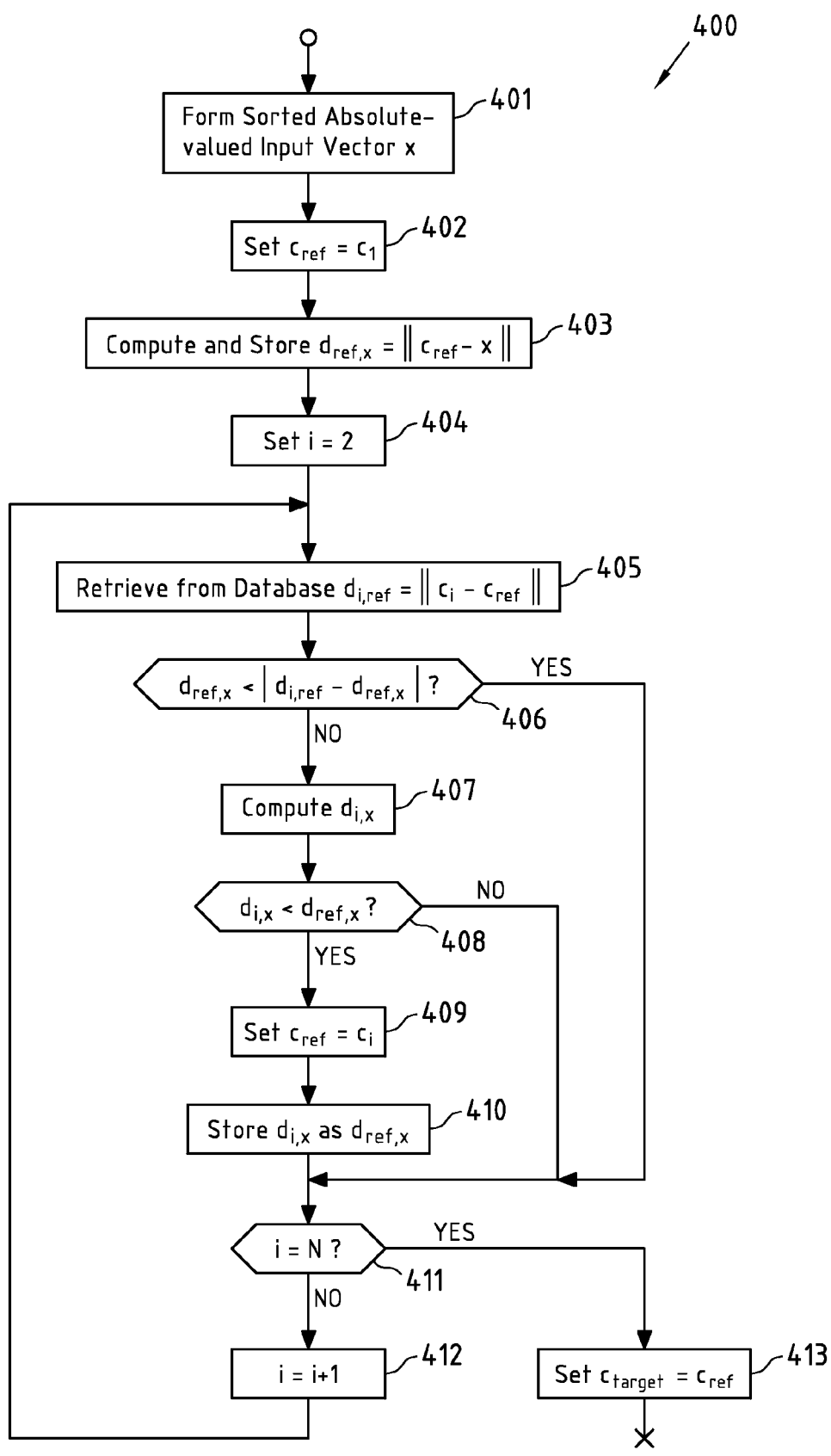
FIG. 4: a flowchart of a processing in step 202 of the flowchart of FIG. 2 according to an embodiment of the invention.

FIG. 4 shows a flowchart 400 of a method for identifying a single target vector from a plurality of candidate vectors according to an embodiment of the invention. Therein, initially a pre-selected candidate vector is used as a reference vector, but this reference vector may change during the execution of the flowchart 400.

Flowchart 400 may for instance be performed in step 202 of the flowchart 200 of FIG. 2, for instance by processor 10 of apparatus 1 (see FIG. 1). Accordingly, the steps of flowchart 400 may be embodied as program code 32 of computer program 31 stored on tangible storage medium 30 of FIG. 3.

For the description of flowchart 400, it is assumed that there are N candidate vectors $\{c_1, \ldots, c_N\}$, from which a target vector has to be selected. Therein, N is an integer larger than 1. In the present example, each candidate vector has positive elements only, which are sorted decreasingly, so that the first element of a candidate vector is larger than the second element, which in turn is larger than the third element, etc. It is assumed that each candidate vector is associated with a class of code vectors, comprising the candidate vector and further code vectors that are obtained by signed permutations of the elements of the candidate vector. For one or more of the candidate vectors, there may exist sign constraints, for instance in a way that the number of minus signs for these candidate vectors (i.e. in their signed permutations) must be even or odd.

In a step 401, an input vector (for instance the input vector obtained in step 201 of FIG. 2) is transformed into an at least sorted representation, which is in the present example a sorted absolute-valued representation of the input vector. This sorted absolute-valued representation will be denoted as x in the following and is obtained from the input vector by forming a respective absolute value of its elements and sorting these absolute-valued elements to match the sorting of the candidate vectors, i.e. in the present example, decreasingly.

In a step 402, a reference vector $c_{ref}$ is defined. $c_{ref}$ may for instance be defined as the first candidate vector $c_1$ of the set of candidate vectors as shown in FIG. 4, but this is not mandatory.

In a step 403, then the distance $d_{ref,x}$ is computed and stored (for instance in main memory 12 of apparatus 1, see FIG. 1). $d_{ref,x}$ is obtained by applying a distance metric to the reference vector $c_{ref}$ and the sorted absolute-valued input vector x. For the description of the flowchart 400 of FIG. 4, it is assumed that this distance metric is a Euclidean metric, but that is only an example, also other metrics are applicable.

In step 404, a loop variable i is set equal to 2.

In a step 405, a distance $d_{i,ref}$ is retrieved from a database. Distance $d_{i,ref}$ denotes the distance between candidate vector $c_i$ and the reference vector $c_{ref}$. Since both candidate vector $c_i$ and reference vector $c_{ref}$ are candidate vectors (see step 402), that are independent of the sorted absolute-valued input vector x, this distance, and also the distance between all possible pairs of candidate vectors, is pre-computed and stored in a memory, for instance in main memory 12 of the apparatus 1 of FIG. 1. These distances may for instance be contained in the firmware of apparatus 1 of FIG. 1, and may only be changed or updated if the set of candidate vectors changes. However, if there exist different sets of candidate vectors, for instance for coding of different types of signals or for coding with different quantization granularity, for each of these sets of candidate vectors, according distances of all possible pairings within each set of candidate vectors may be pre-computed and stored.

In step 406, it is checked whether an absolute value of the difference between the distance $d_{i,ref}$ and the distance $d_{ref,x}$ is larger than the distance $d_{ref,x}$. This check is indicative of whether a distance $d_{i,x}$ between candidate vector $c_i$ and the sorted absolute-valued input vector x will be larger than a distance $d_{ref,x}$ between $c_{ref}$ and the sorted absolute-valued input vector x. Thus actual computation of the distance $d_{i,x}$ makes only sense if it is not for sure larger than the distance $d_{i,ref}$. Therein, it is to be noted that the checking performed in step 405 only is based on $d_{i,ref}$, which has been retrieved from a pre-computed database in step 405, and on $d_{ref,x}$, which has already been computed and stored in step 403 (for higher values of the loop variable i, $d_{ref,x}$ is available either from the computation in step 403 or from previous computations of step 408, as will be discussed below). Thus the checking performed in step 406 is computationally cheap.

The checking performed in step 406 can be derived from the triangle inequality applied to the vectors $c_i$, $c_{ref}$ and x as follows:

$$|\|c_{ref}-x\|-\|c_i-c_{ref}\|| \le \|c_i-x\| \le \|c_{ref}-x\|+\|c_i-c_{ref}\|. \quad (1)$$

This is equivalent to:

$$|d_{ref,x}-d_{i,ref}| \le d_{i,x} \le d_{ref,x}+d_{i,ref} \quad (2)$$

It follows that distance $d_{i,x}$ is larger than distance $d_{ref,x}$ if the following holds:

$$d_{ref,x} < |d_{i,ref}-d_{ref,x}| \quad (3)$$

In that case, there is no need to compute $d_{i,x}$, since, when plugging inequality (3) into the first part of inequality (2), it is seen that then $d_{ref,x} < d_{i,x}$ holds.

If the checking in step 406 yields a negative result, the distance $d_{i,x}$ between the present candidate vector $c_i$ and the sorted absolute-valued input vector x is not for sure larger than the distance $d_{i,ref}$ between the present candidate vector $c_i$ and the reference vector $c_{ref}$ (the up-to-then best candidate vector). Actually, no information on the relationship between these two distances is then available at all.

Consequently, the distance $d_{i,x}$ between the present candidate vector $c_i$ and the sorted absolute-valued input vector x is computed in step 407 and compared against the distance $d_{ref,x}$ in step 408. If this check reveals that the distance $d_{i,x}$ is smaller than the distance $d_{ref,x}$, the present candidate vector $c_i$ is made the new reference vector $c_{ref}$ in step 409 (reflecting the fact that the reference vector $c_{ref}$ is always considered to be the up-to-then checked candidate vector that is closest to the sorted absolute-valued input vector), and the distance $d_{i,x}$ between this present candidate vector $c_i$ and the sorted absolute-valued input vector x is stored as distance $d_{ref,x}$ in step 410 (for later reference by step 406). If the check in step 408 reveals that the distance $d_{i,x}$ is not smaller than the distance $d_{ref,x}$, steps 409-410 are skipped.

In step 411, it is checked if the loop variable i has already reached N, i.e. if all candidate vectors have already been checked. If this is not the case, the loop variable i is increased by one in step 412, and the flowchart jumps back to step 405 to check the next candidate vector. If the checking in step 411 reveals that the loop variable i is equal to N, the reference vector is made the target vector $c_{target}$ in step 413, and the flowchart terminates.

If the checking in step 406 yields a positive result, the computation of the distance $d_{i,x}$ between the present candidate vector and the sorted absolute-valued input vector is not required, since it will be larger than the distance $d_{ref,x}$. The flowchart then jumps to step 411.

It should be noted that the condition "$d_{i,x} < d_{ref,x}$" in step 408 of FIG. 4 could—as an alternative—also be changed to "$d_{i,x} \leq d_{ref,x}$". Then, still only one target vector would be identified by the flowchart 400 of FIG. 4. Nevertheless, it may for instance be desirable to use the condition "$d_{i,x} < d_{ref,x}$" to force that the reference candidate vector will be identified as target vector even if there are one or more other candidate vectors that have the same distance towards the sorted absolute-valued representation of the input vector x. This may for instance be advantageous if the reference vector (or the one or more code vectors associated with it) requires less bits to be identified as compared to the other candidate vectors (or the one or more code vectors respectively associated with them) and/or if an identification of the reference vector (or the one or more code vectors associated with it) is pre-computed or easier to determine as compared to an identification of the other candidate vectors (or the one or more code vectors respectively associated with them).

As stated above, the candidate vectors are associated with respective classes of code vectors that respectively contain the respective candidate vectors and further code vectors obtainable from the respective candidate vectors via signed permutations (with some possible constraints concerning the number of minus signs in a code vector). All of these code vectors together form a codebook. Now, to determine, based on the target vector identified by the flowchart 400 of FIG. 4, the actual code vector that has the smallest distance towards the input vector (as for instance in step 203 of the flowchart 200 of FIG. 2), for instance the following steps can be applied:

(a) A permutation operation that would transform the sorted absolute-valued input vector x back into its non-sorted (but still absolute-valued) form is performed on the elements of the target vector $c_{target}$.

(b) If elements of the original input vector have a negative sign, this respective negative sign is assigned to elements of the permuted target vector that are at corresponding positions.

(c) If there are sign constraints imposed on the code vectors associated with the target vector $c_{target}$ (for instance concerning the number of minus signs within a code vector), these sign constraints are met by accordingly toggling the sign of the smallest element of the vector obtained in step (b).

The resulting vector then is the code vector from the codebook that has the smallest distance towards the input vector.

It has already been stated that the candidate vectors from which a target vector is identified may for instance be leader vectors (for instance leader vectors as defined in the above-cited reference "Multiple-scale leader-lattice VQ with application to LSF quantization"). Equally well, the candidate vectors may be scaled leader vectors that are associated with leader classes that are in turn associated with sets of one or more scales. Examples of such leader classes are also presented in the above-cited reference "Multiple-scale leader-lattice VQ with application to LSF quantization". If there is a single common scale for all the leader vectors, then (instead of scaling the leader vectors), the input vector can be correspondingly scaled and the flowchart of FIG. 4 can be performed with the leader vectors (as candidate vectors) as in the non-scaled case (but with the modified input vector).

It is also possible that the candidate vectors are partially leader vectors and partially scaled leader vectors. For all of these scenarios, the embodiments of FIGS. 1-4 (and also the embodiment of FIG. 6 described below) are applicable.

In the following, with reference to FIG. 5, an example for the identification of a single target vector from a set of candidate vectors and the determination of the code vector that has the smallest distance towards an input vector based on this target vector will be given under the assumption that all candidate vectors are leader vectors.

Figure 5:
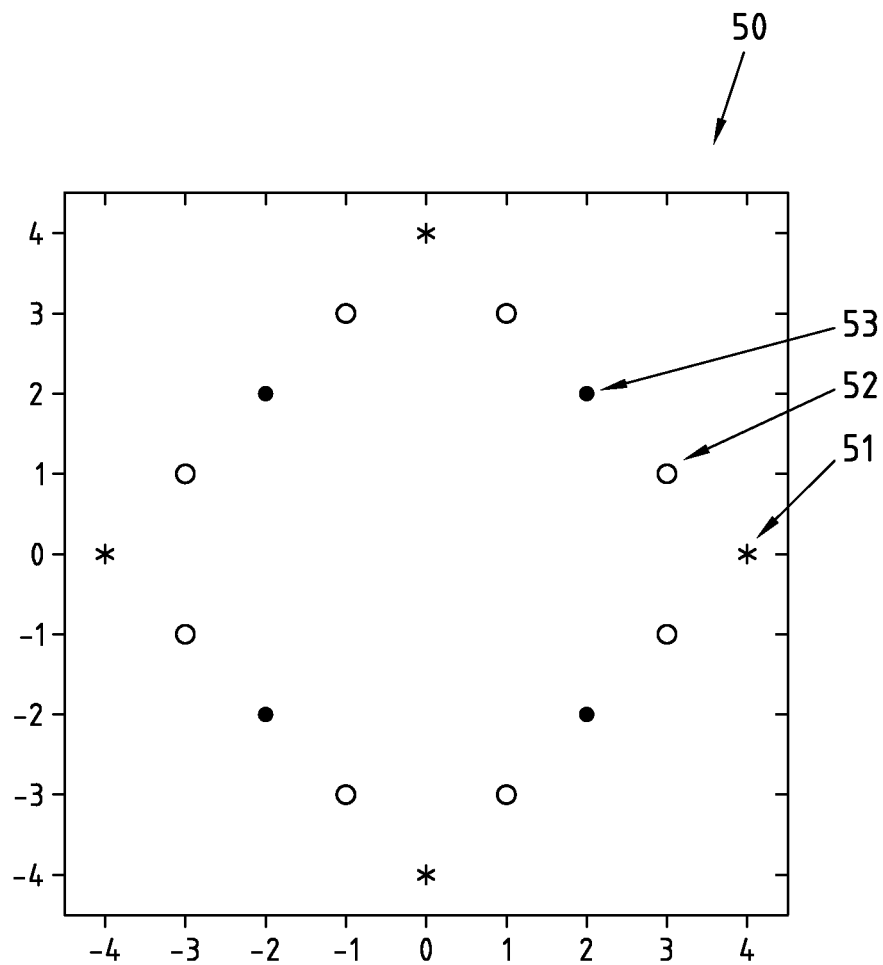
FIG. 5: an illustration of a codebook composed of three leader classes according to an embodiment of the present invention.

FIG. 5 shows a Cartesian coordinate system 50 with a plurality of two-dimensional code vectors that are represented by different signs. The code vectors belong to three different leader classes, wherein the union of these leader classes forms a codebook.

The first leader class has four code vectors marked by a star and is derived by signed permutations from leader vector 51, which has coordinates [4,0]. This first leader class has the following code vectors: {[4,0], [0,4], [−4,0], [0,−4]}. Apparently, there are no sign constraints. It can be seen that the leader vector [4,0] has only positive elements, which are ordered decreasingly. This also holds for the leader vectors of the second and third leader class described below.

The second leader class has eight code vectors marked by a circle and is derived by signed permutations from leader vector 52, which has coordinates [3,1]. This second leader class has the following code vectors: {[3,1], [1,3], [−1,3], [−3,1], [−3,−1], [−1,−3], [1,−3], [3,−1]}. Apparently, there are no sign constraints.

The third leader class has four code vectors marked by a dot and is derived by signed permutations from leader vector 53, which has coordinates [2,2]. This third leader class has the following code vectors: {[2,2], [−2,2], [−2,−2], [2,−2]}. Apparently, there are no sign constraints.

Now, if the code vector of the codebook (represented by the 16 code vectors of FIG. 5) that has the smallest distance towards an input vector shall be determined, this may be accomplished by calculating the distance between a sorted absolute-valued representation of the input vector with respect to all three leader vectors, selecting the leader vector that yield the smallest distance, and determining the code vector based on this selected leader vector.

Performing this approach for an example input vector [0,−3.5] (not shown in FIG. 5) would then take the following shape:

The sorted absolute-valued input vector would be obtained as [3.5,0].

The distance (here an Euclidean metric is used as an example) of this sorted absolute-valued input vector [3.5,0] towards the first leader vector [4,0] would be 0.5.

The distance of the sorted absolute-valued input vector [3.5,0] towards the second leader vector [3,1] would be 1.12.

The distance of the sorted absolute-valued input vector [3.5,0] towards the third leader vector [2,2] would be 2.5.

Thus the first leader vector would be selected, since it yields the smallest distance towards the sorted absolute valued input vector.

The code vector in the first leader class associated with this first leader vector is then obtained by permuting the elements of the first leader vector [4,0] in a way that would transform the sorted absolute-valued input vector [3.5,0] back into the absolute-valued input vector [0,3.5], i.e. the first leader vector [4,0] is permuted into [0,4].

Then, the signs of elements of the input vector [0,−3.5] are assigned to elements at the same position in the permuted first leader vector [0,4], yielding the code vector [0,−4].

As can be seen, among all of the 16 code vectors in FIG. 5, the code vector [0,−4] is the one that has the smallest distance towards the input vector [0,−3.5].

However, this finding required the explicit calculation of three distances in a two-dimensional space, since the triangle inequality was not exploited.

In contrast, when determining the code vector that has the smallest distance towards the input vector [0,−3.5] according to embodiments of the present invention, the computational complexity can be further reduced, as will be shown with reference to the flowchart of FIG. 4 in the following.

Therein, it is assumed that the distances between the three leader vectors [4,0], [3,1] and [2,2] have been pre-computed and stored in a database, so that they are not considered to add computational complexity to the present example.

In step 401 (see FIG. 4), the sorted absolute-valued input vector x=[3.5,0] is determined based on the input vector [0,−3.5].

In step 402, then the reference vector $c_{ref}$ is set equal to the first leader vector [4,0].

In step 403, the distance between the reference vector [4,0] and the sorted absolute-valued input vector [3.5,0] is determined to be 0.5

In step 404, the loop variable i is increased to 2, which means that now the second leader vector is checked.

In step 405, the pre-computed distance between the first and second leader vector is then retrieved, which amounts to 1.41.

The checking in step 406 then yields a positive result, since the absolute value of (1.41−0.5) is larger than 0.5. Therefore, the distance between the second leader vector and the sorted absolute-valued input vector is not computed (step 407 is not executed). Instead, the flowchart jumps to step 411 and then to step 412, where i is increased to 3.

This means that now the third leader vector is checked. To this end, the pre-computed distance between the first leader vector and the third leader vector is retrieved in step 405 and amounts to 2.82.

The checking in step 406 is again positive, since the absolute value of (2.8−0.5) is larger than 0.5. Therefore, the distance between the third leader vector and the sorted absolute-valued input vector is not computed (step 407 is not executed). Instead, the flowchart jumps to step 411 and then, since the number of leader vectors N is 3 (like i), to step 413, where the reference vector $c_{ref}$ (which still is the first leader vector [4,0] as set in step 402) is defined as the target vector $c_{target}$.

Based on this first leader vector [4,0], then the code vector [0,−4] of the codebook that has the smallest distance towards the input vector [0,−3.5] can be determined by permutation and sign assignment as shown above.

It can thus be seen that instead of computing the distance of all three leader vectors with respect to the sorted absolute-valued input vector and comparing these results with each other, only the distance between the first leader vector and the sorted absolute-valued input vector had to be computed, and for each leader vector, a comparison of already computed values had to be performed. The further computations involved in step 406 (such as forming a difference and an absolute value thereof) are of negligible computational complexity, in particular if the dimensions (the numbers of elements) of the leader vectors increase.

It may be comprehended from the above example that the amount of reduction of computational complexity also depends on the sequence in which the leader vectors are checked. If the best leader vector is checked first (as in the above example), the distances for the other leader vectors do not have to be computed, and the reduction in computational complexity is largest. However, also in cases where the best leader vector is not checked first, still a significant reduction of the computational complexity is achieved, since only for those leader vectors that do not for sure have a larger distance towards the sorted absolute-valued input vector as compared to previously checked leader vectors this distance is actually computed.

Figure 6:
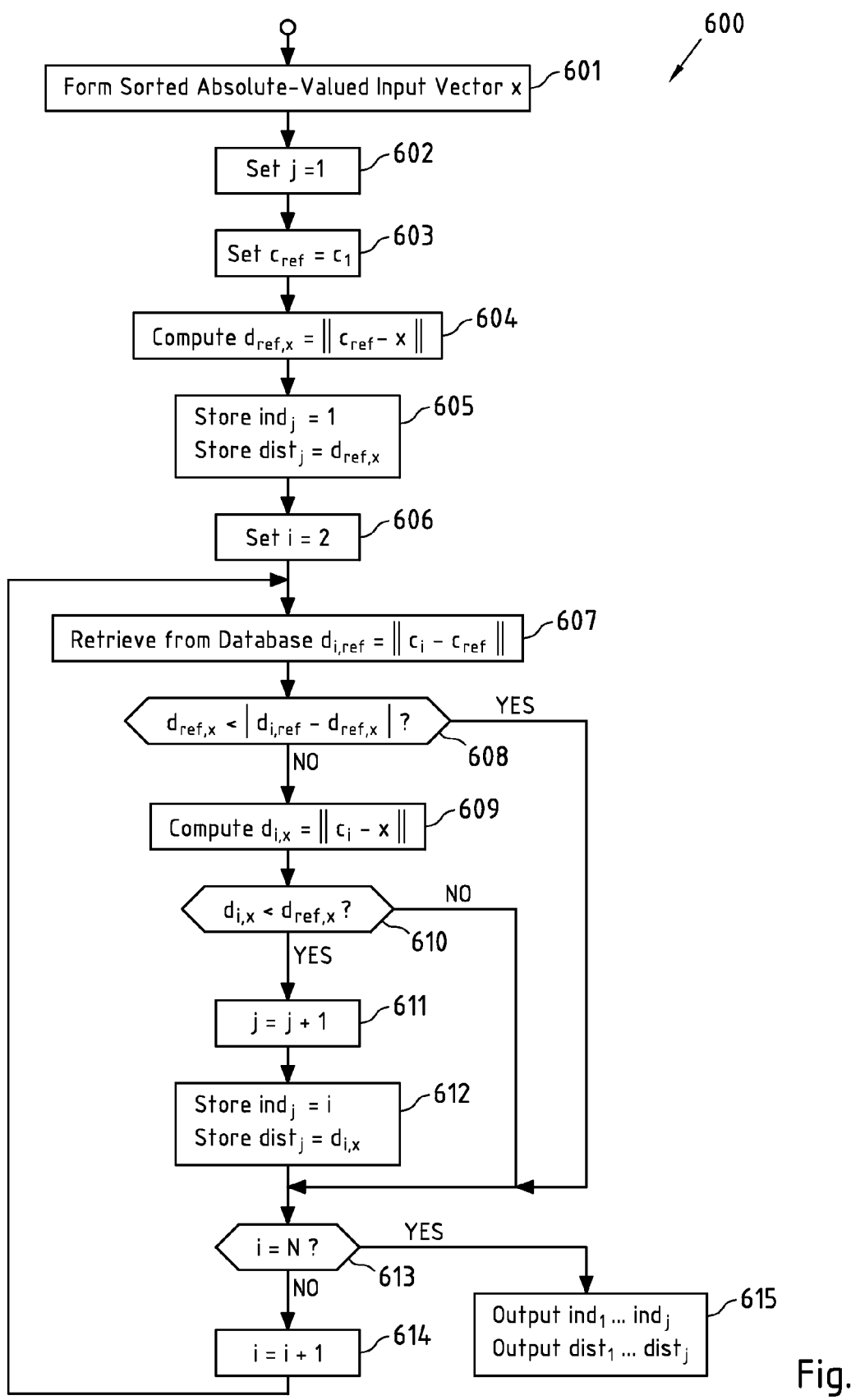
FIG. 6: a flowchart of a processing in step 202 of the flowchart of FIG. 2 according to a further embodiment of the invention.

FIG. 6 shows a flowchart 600 of a method for identifying one or more target vectors from a plurality of candidate vectors according to an embodiment of the invention. Therein, the same candidate vector is used as a reference vector in all checking operations. In contrast to the flowchart 400 of FIG. 4, this allows potentially identifying more than one target vector (and thus also more than one code vector that is close to the input vector). However, the actual number of target vectors that are identified inter alia depends on the choice of the reference vector, as will be described below.

Flowchart 600 may for instance be performed in step 202 of the flowchart 200 of FIG. 2, for instance by processor 10 of apparatus 1 (see FIG. 1). Accordingly, the steps of flowchart 600 may be embodied as program code 32 of computer program 31 stored on tangible storage medium 30 of FIG. 3.

For the description of flowchart 600, it is assumed that there are N candidate vectors $\{c_1, \ldots, c_N\}$, from which one or more target vectors have to be selected. Therein, N is an integer larger than 1. Each candidate vector again is—as an example—assumed to have positive elements only, which are sorted decreasingly, so that the first element of a candidate vector is larger than the second element, which in turn is larger than the third element, etc. It is assumed that each candidate vector is associated with a class of code vectors, comprising the candidate vector and further code vectors that are obtained by signed permutations of the elements of the candidate vector. For one or more of the candidate vectors, there may exist sign constraints, for instance in a way that the number of minus signs for these candidate vectors (i.e. in their signed permutations) must be even or odd. There may also be one or more candidate vectors in the set of N candidate vectors that are associated with classes of code vectors that only comprise the respective candidate vector, but no further code vectors (for instance, if the candidate vector is the null vector, no further code vectors can be obtained by signed permutation).

In a step 601 of flowchart 600, an input vector (for instance the input vector obtained in step 201 of FIG. 2) is transformed into a sorted absolute-valued input vector x (which is an example of an at least sorted representation of the input vector) by forming a respective absolute value of its elements and sorting these absolute-valued elements to match the sorting of the candidate vectors, i.e. in the present example, decreasingly.

In a step 602, a counter variable j for the target vectors is set to 1.

In a step 603, a reference vector $c_{ref}$ is defined. $c_{ref}$ may for instance be defined as the first candidate vector $c_1$ of the set of candidate vectors $\{c_1, \ldots, c_N\}$ as shown in FIG. 6, but this is not mandatory. This reference vector $c_{ref}$ is kept constant for all following operations of flowchart 600.

In a step 604, then the distance $d_{ref,x}$ is computed (for instance in main memory 12 of apparatus 1, see FIG. 1). $d_{ref,x}$ is obtained by applying a distance metric to the reference vector $c_{ref}$ and the sorted absolute-valued input vector x. For the description of the flowchart 600 of FIG. 6, it is assumed that this distance metric is a Euclidean metric, but that is only an example, also other metrics are applicable.

In a step 605, a variable $ind_j$ is set equal to 1 and stored. Furthermore, a variable $dist_j$ is set equal to $d_{ref,x}$ and stored. The pair of variables $ind_j$ and $dist_j$ with j=1 (see step 602) is representative of the first target vector identified by the flowchart 600 of FIG. 6, and will be output in step 613. Therein, variable $ind_j$ indicates the index i of this first target vector in the set of candidate vectors $\{c_1, \ldots, c_N\}$, and $dist_j$ indicates the distance between this first target vector with respect to the sorted absolute-valued representation of the input vector.

In step 606, a loop variable i is set equal to 2.

In a step 607, a distance $d_{i,ref}$ is retrieved from a database. Distance $d_{i,ref}$ denotes the distance between candidate vector $c_i$ and the reference vector $c_{ref}$. Since both the candidate vector $c_i$ and reference vector $c_{ref}$ are independent of the sorted absolute-valued input vector x, this distance, and also the distance between the reference vector and all further candidate vectors (excluding the reference vector) are pre-computed and stored in a memory, for instance in main memory 12 of the apparatus 1 of FIG. 1. These distances may for instance be contained in the firmware of apparatus 1 of FIG. 1, and may only be changed or updated if the set of candidate vectors changes. However, if there exist different sets of candidate vectors, for instance for coding of different types of signals or for coding with different quantization granularity, for each of these sets of candidate vectors, according distances between the reference vector and all other candidate vectors within each set of candidate vectors may be pre-computed and stored.

In step 608, it is checked whether an absolute value of the difference between the distance $d_{i,ref}$ and the distance $d_{ref,x}$ is larger than the distance $d_{ref,x}$.

This check is indicative of whether a distance $d_{i,x}$ between candidate vector $c_i$ and the sorted absolute-valued input vector x will be for sure larger than a distance $d_{ref,x}$ between $c_{ref}$ and the sorted absolute-valued input vector x. Thus actual computation of the distance $d_{i,x}$ makes only sense if it is not for sure larger than the distance $d_{i,ref}$. Therein, it is to be noted that the checking performed in step 608 only is based on $d_{i,ref}$, which has been retrieved from a pre-computed database in step 607, and on $d_{ref,x}$, which has already been computed in step 603 and stored in step 604. Thus the checking performed in step 608 is computationally cheap.

If the checking in step 608 yields a negative result, the distance $d_{i,x}$ between the present candidate vector $c_i$ and the sorted absolute-valued input vector x is not for sure larger than the distance $d_{i,ref}$ between the present candidate vector and the reference vector $c_{ref}$. Consequently, the distance $d_{i,x}$ between this present candidate vector $c_i$ and the sorted absolute-valued input vector x is computed and stored in step 609.

It is then checked in a step 610 if the distance $d_{i,x}$ is smaller than the distance $d_{ref,x}$. If this is the case, the variable j counting the identified target vectors is increased by one in a step 611, and, in a step 612, the current value of i is stored in the variable $ind_j$, and the current distance $d_{i,x}$ is stored in the variable $dist_j$. If the check in step 610 yields a negative result, step 611 and 612 are skipped.

In step 613, it is checked if the loop variable i has already reached N, i.e. if all candidate vectors have already been checked. If this is not the case, the loop variable i is increased by one in step 614, and the flowchart jumps back to step 607 to check the next candidate vector. If the checking in step 613 reveals that the loop variable i is equal to N, all variables $ind_1 \ldots ind_j$, storing the indices of the j identified target vectors, and their respective distances $dist_1 \ldots dist_j$ towards the sorted absolute-valued representation of the input vector are output in a step 615. The flowchart then terminates.

If the checking in step 608 yields a positive result, the computation of the distance $d_{i,x}$ between the present candidate vector $c_i$ and the sorted absolute-valued input vector x is not required, since it will for sure be larger than the distance $d_{ref,x}$. The flowchart then jumps to step 613.

The j target vectors identified by the flowchart 600 of FIG. 6 may then for instance be further processed according to step 203 of flowchart 200 of FIG. 2. For instance, for each of these j target vectors, the respective code vectors in the respective class of code vectors associated with the target vectors that are—among the code vectors of the respective classes—nearest to the input vector may be determined in the same way as already described for a single target vector in the context of FIG. 4 above.

Therein, it can be comprehended that the number j of target vectors identified by the flowchart 600 of FIG. 6 strongly depends on the distance between the reference vector $c_{ref}$ and the sorted absolute-valued representation of the input vector.

For instance, if this distance is small, for instance the smallest distance that can be achieved in the set of N candidate vectors, only the reference vector will be identified as target vector by the flowchart 600 of FIG. 6, since for all other candidate vectors, the checking in step 608 will be positive.

Otherwise, if this distance is large, for instance the largest distance that can be achieved in the set of N candidate vectors, distances $d_{i,x}$ for all other N−1 candidate vectors will be computed, since the checking in step 608 will be negative for all of these N−1 candidate vectors. Then, all candidate vectors (including the reference vector), will be output as target vectors in step 614.

It may thus for instance be advisable to choose, as the reference vector, a candidate vector that is close to the average position of the input vector (e.g. the average position when considering a plurality of different input vectors), such as for instance the null vector.

In the following, with reference to FIG. 7, an example for the identification of several target vectors from a set of candidate vectors and the determination of the code vectors that have (within the respective classes of code vectors associated with the target vectors) the smallest distances towards an input vector based on these target vectors will be given under the assumption that all candidate vectors are leader vectors.

Figure 7:
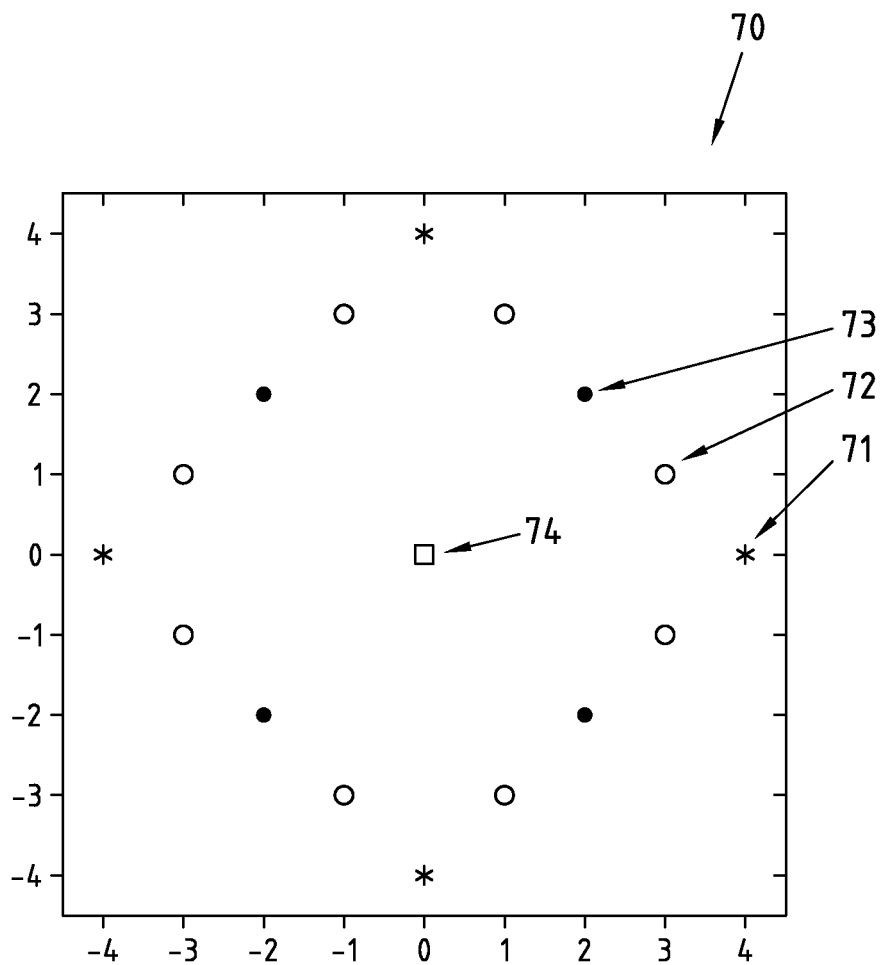
FIG. 7: an illustration of a further codebook composed of four leader classes according to an embodiment of the present invention.

FIG. 7 shows a Cartesian coordinate system 70 with a plurality of two-dimensional code vectors that are represented by different signs. The code vectors belong to four different leader classes, wherein the union of these leader classes forms a codebook. There exists a first leader vector 74, which is the null vector. This leader vector 74 is marked by the square sign, and has a leader class that only comprises the leader vector 74. Furthermore, there are three leader vectors 71, 72 and 73 and their respectively associated leader classes, which correspond to the leader vectors 51, 52 and 53 and their respectively associated leader classes as already described in the context of FIG. 5.

The set of leader vectors thus is defined as $\{[0,0], [4,0], [3,1], [2,2]\}$. Assuming that the first leader vector $[0,0]$ will be used as reference vector (see step 601 of the flowchart 600 of FIG. 6), the following distances will be pre-computed:

$$d_{2,ref}=4$$

$$d_{3,ref}=3.16$$

$$d_{4,ref}=2.82$$

Now, consider the case that target vectors shall be identified with respect to an input vector $[0,2]$ (not shown in FIG. 7).

In step 601, the sorted absolute-valued representation of the input vector [0,2] is then obtained as x=[0,2].

In step 604, the distance $d_{ref,x}=2$ is determined and stored in step 605 as $dist_1=2$, together with $ind_1=1$.

The checking in step 608 is then performed based on $d_{ref,x}$ (computed in step 604) and $d_{2,ref}$ (pre-computed). It is thus checked if 2<2 holds, which is negative, so that the distance $d_{2,x}=2$ is computed in step 609. The check in step 610 then reveals that $d_{2,x}=2$ is not smaller than $d_{ref,x}=2$, so that steps 611 and 612 are skipped, i.e. $c_2$ is not identified as a target vector.

The checking for the third leader vector (i=3) is then performed based on $d_{ref,x}$ (computed in step 604) and $d_{3,ref}$ (pre-computed). It is thus checked if 2<1.16 holds, which is negative, so that the distance $d_{3,x}=1.41$ is computed in step 609. The check in step 610 then reveals that $d_{3,x}=1.41$ is smaller than $d_{ref,x}=2$, so that distance $d_{3,x}$ is stored as $dist_2=2$, together with $index_2=3$ in step 612, i.e. $c_3$ is identified as a target vector.

Finally, checking for the fourth leader vector (i=4) is performed based on $d_{ref,x}$ (computed in step 604) and $d_{4,ref}$ (pre-computed). It is thus checked if 2<0.82 holds, which is negative, so that the distance $d_{4,x}=2$ is computed in step 609. The check in step 610 then reveals that $d_{4,x}=2$ is not smaller than $d_{ref,x}=2$, so that steps 611 and 612 are skipped, i.e. $c_4$ is not identified as a target vector.

Thus leader vectors c1 (with distance $d_{1,x}=2$) and c3 (with distance $d_{3,x}=1.41$) are output as target vectors, together with their corresponding distances towards the sorted absolute-valued representation of the input vector x.

Therein, the fact that the distance $d_{ref,x}=2$ was larger than or equal to the distances of the other leader vectors towards the sorted absolute-valued representation of the input vector caused each checking in step 608 to be negative and thus the distances to be computed (step 609).

As an alternative example, consider the case that target vectors shall be identified with respect to an input vector [1,1] (not shown in FIG. 7).

In step 601, the sorted absolute-valued representation of the input vector [1,1] is then obtained as x=[1,1].

In step 604, the distance $d_{ref,x}=1.41$ is determined and stored in step 605 as $dist_1=1.41$, together with $ind_1=1$.

The checking in step 608 is then performed based on $d_{ref,x}$ (computed in step 604) and $d_{2,ref}$ (pre-computed). It is thus checked if 1.41<2.59 holds, which is positive, so that the distance $d_{2,x}$ is not computed.

The checking for the third leader vector (i=3) is then performed based on $d_{ref,x}$ (computed in step 604) and $d_{3,ref}$ (pre-computed). It is thus checked if 1.41<1.75 holds, which is positive, so that the distance $d_{3,x}$ is not computed. Finally, checking for the fourth leader vector (i=4) is performed based on $d_{ref,x}$ (computed in step 604) and $d_{4,ref}$ (pre-computed). It is thus checked if 1.41<1.41 holds, which is negative, so that the distance $d_{4,x}=1.41$ is computed in step 609. The check in step 610 then reveals that $d_{4,x}=1.41$ is not smaller than $d_{ref,x}=1.41$, so that steps 611 and 612 are skipped.

Thus only one leader vector ($c_{ref}=c_1$) is output as target vector, together with its corresponding distance towards the sorted absolute-valued representation of the input vector x.

Here, the fact that the distance $d_{ref,x}=1.41$ was smaller than the distances of the second and third leader vectors towards the sorted absolute-valued representation of the input vector caused the checking in step 608 to be positive for these two leader vectors, so that their respective distances were not computed. For the fourth leader vector $c_4$, the check of step 608 was negative, so that the distance $d_{4,x}$ was computed in step 609, but then the check of step 610 revealed that $c_4$ is not closer to x than $c_{ref}$, so that $c_4$ was not identified as a target vector.

Thus the target vector ([0,0]) associated with the leader class that contains the code vector ([0,0]) that has the smallest distance with respect to the input vector ([1,1]) has been identified without having to compute the distances of at least two ([4,0] and [3,1]) of the three other leader vectors in the set of four leader vectors.

Consequently, as it is apparent from the above examples, when considering a plurality of different input vectors for which one or more target vectors are to be identified, there will be several situations where not all distances of the leader vectors towards the sorted absolute-valued representation of the input vector x have to be computed (see step 609), so that the computational complexity is significantly lower as compared to a brute-force computation of the distances between the sorted absolute-valued representation of the input vector and all leader vectors, while still preserving the advantage that in general not only a single target vector (and its associated code vector), but more than this single target vector (with their associated code vectors) are obtained. This can for instance be exploited to select one of these target vectors (and its associated code vector) from the identified target vectors based on one or more further criteria, such as for instance the number of bits required to represent the selected target vector (or its associated code vector).

Therein, it is to be noted that the number of identified target vector can be further increased by changing the condition "$d_{i,x}<d_{ref,x}$" in step 610 of FIG. 6 to "$d_{i,x} \leq d_{ref,x}$". Then, in the last example above, also leader vector $c_4$ would have been identified as a target vector.

As used in this application, the term 'circuitry' refers to all of the following:

(a) hardware-only circuit implementations (such as implementations in only analog and/or digital circuitry) and (b) combinations of circuits and software (and/or firmware), such as (as applicable):

(i) to a combination of processor(s) or (ii) to portions of processor (s)/software (including digital signal processor(s)), software, and memory(ies) that work together to cause an apparatus, such as a mobile phone or a positioning device, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a positioning device.

With respect to the aspects of the invention and their embodiments described in this application, it is understood that a disclosure of any action or step shall be understood as a disclosure of a corresponding (functional) configuration of a corresponding apparatus (for instance a configuration of the computer program code and/or the processor and/or some other means of the corresponding apparatus), of a corresponding computer program code defined to cause such an action or step when executed and/or of a corresponding (functional) configuration of a system (or parts thereof).

The aspects of the invention and their embodiments presented in this application and also their single features shall also be disclosed in all possible combinations with each other. It should also be understood that the sequence of method steps in the flowcharts presented above is not mandatory, also alternative sequences may be possible.

The invention has been described above by non-limiting examples. In particular, it should be noted that there are alternative ways and variations which are obvious to a skilled person in the art and can be implemented without deviating from the scope and spirit of the appended claims.

The invention claimed is:

1. A method performed by an apparatus, said method comprising:
identifying one or more target vectors from a plurality of candidate vectors, each candidate vector having sorted elements and being associated with a respective class of one or more code vectors of a codebook and at least one of said candidate vectors being associated with a respective class of two or more code vectors that comprise said respective candidate vector and at least one code vector obtainable from said respective candidate vector by one of permutation and signed permutation, said target vectors having, among all candidate vectors of said plurality of candidate vectors, smallest distances towards a at least sorted representation of an input vector, said identifying comprising:
checking, for a candidate vector of said plurality of candidate vectors, at least based on a distance between said candidate vector and a reference vector and on a distance between said reference vector and said at least sorted representation of said input vector, if a distance between said at least sorted representation of said input vector and said candidate vector is larger than a distance between said at least sorted representation of said input vector and said reference vector; and
computing, when said checking yields a negative result for said candidate vector, a distance between said at least sorted representation of said input vector and said candidate vector, wherein a negative result is given when the distance between said at least sorted representation of said input vector and said candidate vector is not larger than a distance between said at least sorted representation of said input vector and said reference vector.

2. The method according to claim 1, wherein said checking if a distance between said at least sorted representation of said input vector and said candidate vector is larger than said distance between said at least sorted representation of said input vector and said reference vector is performed by checking if an absolute value of a difference between said distance between said candidate vector and said reference vector and said distance between said reference vector and said at least sorted representation of said input vector is larger than distance between said reference vector and said at least sorted representation of said input vector.

3. The method according to claim 1, wherein said checking and, in case that said respective checking yields a negative result, said computing of said distance is performed in said identifying of said one or more target vectors for all candidate vectors of said plurality of candidate vectors except one candidate vector that is used at least once as said reference vector.

4. The method according to claim 1, wherein said reference vector is a pre-selected or randomly chosen candidate vector from said plurality of candidate vectors.

5. The method according to claim 1, wherein said identifying further comprises, in case said checking for said candidate vector yields a negative result, checking if said computed distance between said at least sorted representation of said input vector and said candidate vector is smaller than said distance between said reference vector and said at least sorted representation of said input vector, and defining said reference vector to be said candidate vector if said computed distance between said at least sorted representation of said input vector and said candidate vector is smaller than said distance between said reference vector and said at least sorted representation of said input vector.

6. The method according to claim 5, wherein only one target vector is identified from said plurality of candidate vectors, and wherein said target vector corresponds to said reference vector after a last candidate vector of said plurality of candidate vectors has been checked, and wherein said distance between said candidate vector and said reference vector is retrieved from a memory that comprises distances with respect to all possible pairings of candidate vectors of said plurality of candidate vectors.

7. The method according to claim 5, wherein said distance between said reference vector and said at least sorted representation of said input vector corresponds to a distance between a previously checked candidate vector of said plurality of candidate vectors and said at least sorted representation of said input vector computed for said previously checked candidate vector, and is retrieved from a memory where it has been at least temporarily stored.

8. The method according to claim 1, wherein in said identifying of said one or more target vectors with respect to an input vector, said checking is performed for at least several candidate vectors of said plurality of candidate vectors, and wherein in each said checking, the same reference vector is used, and wherein said distance between said candidate vector and said reference vector is retrieved from a memory that comprises distances between said reference vector and all candidate vectors of said plurality of candidate vectors.

9. The method according to claim 8, wherein in said identifying of said one or more target vectors with respect to an input vector, said distance between said reference vector and said at least sorted representation of said input vector is only computed once.

10. The method according to claim 1, further comprising determining, for at least one of the one or more target vectors, a respective code vector contained in said respective class of code vectors associated with said at least one target vector that has, among all code vectors in said respective class of code vectors, the smallest distance towards said input vector.

11. The method according to claim 10, wherein said determining of said respective code vector comprises:
applying a permutation operation to said target vector associated with said class of code vectors that contains said respective code vector that would undo a sorting of said at least sorted representation of said input vector to obtain a permuted representation of said target vector;
assigning signs to elements of said permuted representation of said target vector that equal signs of elements at corresponding positions in said input vector to obtain a signed permuted representation of said target vector, and
toggling, only if a sign constraint is imposed on said class of code vectors associated with said target vector and if said sign constraint is not met by said signed permuted representation of said target vector, a sign of a smallest element of said signed permuted representation of said target vector to obtain said code vector, and considering said signed permuted representation of said target vector as said code vector, otherwise.

12. An apparatus, comprising at least one processor; and at least one memory including computer program code, said at least one memory and said computer program code configured to, with said at least one processor, cause said apparatus at least to identify one or more target vectors from a plurality of candidate vectors, each candidate vector having at least sorted elements and being associated with a respective class of one or more code vectors of a codebook and at least one of said candidate vectors being associated with a respective class of two or more code vectors that comprise said respective candidate vector and at least one code vector obtainable from said respective candidate vector by one of permutation and signed permutation, said target vectors having, among all candidate vectors of said plurality of candidate vectors, smallest distances towards a at least sorted representation of an input vector, wherein said apparatus caused to identify is further caused to:
  check, for a candidate vector of said plurality of candidate vectors, at least based on a distance between said candidate vector and a reference vector and on a distance between said reference vector and said at least sorted representation of said input vector, if a distance between said at least sorted representation of said input vector and said candidate vector is larger than a distance between said at least sorted representation of said input vector and said reference vector; and
  compute, when said checking yields a negative result for said candidate vector, a distance between said at least sorted representation of said input vector and said candidate vector, wherein a negative result is given when the distance between said at least sorted representation of said input vector and said candidate vector is not larger than a distance between said at least sorted representation of said input vector and said reference vector.

13. The apparatus according to claim 12, wherein said apparatus caused to check if a distance between said at least sorted representation of said input vector and said candidate vector is larger than said distance between said at least sorted representation of said input vector and said reference vector is further caused to chec if an absolute value of a difference between said distance between said candidate vector and said reference vector and said distance between said reference vector and said at least sorted representation of said input vector is larger than said distance between said reference vector and said at least sorted representation of said input vector.

14. The apparatus according to claim 12, wherein said apparatus caused to check and, in case that said respective checking yields a negative result, said apparatus caused to compute said distance is performed for all candidate vectors of said plurality of candidate vectors except one candidate vector that is used at least once as said reference vector.

15. The apparatus according to claim 12, wherein said reference vector is a pre-selected or randomly chosen candidate vector from said plurality of candidate vectors.

16. The apparatus according to claim 12, further caused to, in case said check for said candidate vector yields a negative result, check if said computed distance between said at least sorted representation of said input vector and said candidate vector is smaller than said distance between said reference vector and said at least sorted representation of said input vector, and to define said reference vector to be said candidate vector if said computed distance between said at least sorted representation of said input vector and said candidate vector is smaller than said distance between said reference vector and said at least sorted representation of said input vector.

17. The apparatus according to claim 16, wherein only one target vector is identified from said plurality of candidate vectors, and wherein said target vector corresponds to said reference vector after a last candidate vector of said plurality of candidate vectors has been checked, and wherein the apparatus is further caused to retrieve said distance between said candidate vector and said reference vector from a memory that comprises distances with respect to all possible pairings of candidate vectors of said plurality of candidate vectors.

18. The apparatus according to claim 16, wherein said distance between said reference vector and said at least sorted representation of said input vector corresponds to a distance between a previously checked candidate vector of said plurality of candidate vectors and said at least sorted representation of said input vector computed for said previously checked candidate vector, and is retrieved from a memory where it has been at least temporarily stored.

19. The apparatus according to claim 12, further caused to, in said identify of said one or more target vectors with respect to an input vector, check for at least several candidate vectors of said plurality of candidate vectors, and wherein in each said check, the same reference vector is used, and wherein the apparatus is further caused to retrieve said distance between said candidate vector and said reference vector from a memory that comprises distances between said reference vector and all candidate vectors of said plurality of candidate vectors.

20. The apparatus according to claim 19, further caused to compute, in said identify of said one or more target vectors with respect to an input vector, said distance between said reference vector and said at least sorted representation of said input vector only once.

21. The apparatus according to claim 12, further caused to determine, for at least one of the one or more target vectors, a respective code vector contained in said respective class of code vectors associated with said at least one target vector that has, among all code vectors in said respective class of code vectors, the smallest distance towards said input vector.

22. The apparatus according to claim 21, further caused to determine said respective code vector by causing the apparatus to:
  apply a permutation operation to said target vector associated with said class of code vectors that contains said respective code vector that would undo a sorting of said at least sorted representation of said input vector to obtain a permuted representation of said target vector;
  assign signs to elements of said permuted representation of said target vector that equal signs of elements at corresponding positions in said input vector to obtain a signed permuted representation of said target vector, and
  toggle, only if a sign constraint is imposed on said class of code vectors associated with said target vector and if said sign constraint is not met by said signed permuted representation of said target vector, a sign of a smallest element of said signed permuted representation of said target vector to obtain said code vector, and considering said signed permuted representation of said target vector as said code vector, otherwise.

* * * * *